United States Patent

Bezama et al.

[11] Patent Number: 5,882,455
[45] Date of Patent: Mar. 16, 1999

[54] APPARATUS AND METHOD FOR FORMING ISOTROPIC MULTILAYER CERAMIC SUBSTRATES

[75] Inventors: Raschid J. Bezama, Mahopac; Govindarajan Natarajan, Pleasant Valley; Robert W. Pasco, Wappingers Falls, all of N.Y.

[73] Assignee: International Business Machines Corporation, Aromonk, N.Y.

[21] Appl. No.: 937,190

[22] Filed: Sep. 25, 1997

[51] Int. Cl.[6] .................................................... B32B 31/20
[52] U.S. Cl. .................................. 156/89.23; 156/89.12; 156/323; 156/580
[58] Field of Search .......................... 156/89.11, 89.12, 156/89.23, 323, 580, 583.1

[56] References Cited

U.S. PATENT DOCUMENTS

| | | | |
|---|---|---|---|
| 3,797,986 | 3/1974 | Onder | 425/352 |
| 4,640,711 | 2/1987 | Lichti et al. | 75/248 |
| 4,929,295 | 5/1990 | Kohno et al. | 156/230 |
| 5,057,171 | 10/1991 | Horner et al. | 156/89 |
| 5,314,646 | 5/1994 | Strobel et al. | 264/6 |
| 5,435,875 | 7/1995 | Saitoh et al. | 156/245 |
| 5,468,315 | 11/1995 | Okada et al. | 156/64 |
| 5,507,896 | 4/1996 | Yoshimura et al. | 156/89.11 |
| 5,573,622 | 11/1996 | Hass et al. | 156/289 |
| 5,676,788 | 10/1997 | Natarajan et al. | 156/285 |
| 5,683,535 | 11/1997 | Karr | 156/285 |

*Primary Examiner*—James Sells
*Attorney, Agent, or Firm*—Ira D. Blecker

[57] ABSTRACT

Disclosed is an apparatus for laminating a plurality of ceramic greensheets which includes a frame, a bottom plate at one end of the frame, a punch at a second end of the frame, and a non-metallic pad within the frame and between the bottom plate and punch. In operation, a plurality of ceramic greensheets are placed within the frame, the non-metallic pad is placed underneath of, or on top of, the plurality of ceramic greensheets, and pressure is applied to the non-metallic pad and the plurality of ceramic greensheets wherein the non-metallic pad causes the lamination pressure to be uniformly distributed across the plurality of ceramic greensheets. Also disclosed is a method for laminating a plurality of ceramic greensheets using the non-metallic pad.

51 Claims, 3 Drawing Sheets

APPARATUS AND METHOD FOR FORMING ISOTROPIC MULTILAYER CERAMIC SUBSTRATES

BACKGROUND OF THE INVENTION

The present invention relates generally to a new quasi-isostatic lamination apparatus and quasi-isostatic lamination method for forming semiconductor ceramic carriers or substrates (hereafter semiconductor substrates or just substrates) with isotropic density.

Semiconductor substrates and devices are becoming smaller and more dense with the evolution of new technologies. However, increases in circuit density produce a corresponding increase in overall manufacturing problems. These manufacturing problems must, however, be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability, process improvements alone are not sufficient to eliminate all the random defects which affect both yield and reliability. Historically, screening techniques have been employed to improve product failure rates to acceptable levels by culling out many of these random defects.

In their desire to improve their products, the semiconductor substrate manufacturers are constantly finding new ways and new techniques to improve or provide new products. It has been found that for most applications, control of sintered substrate dimensions like camber, distortion, feature positional accuracy and overall substrate size are extremely important for post-sinter operations like chip attach and bonding/joining. For a given substrate material set or a given green sheet technology, the actual sintered dimensions may depend on substrate design, such as the amount of metal loading and metal distribution; ceramic and metal compaction and their distribution due in part to lamination pressure and pressure distribution across the substrate; and substrate thickness and sintering conditions. Usually, there is no choice available for a ceramic foundry on metal loading and distribution as well as substrate thickness. Even though the foundry has the option of altering the sintering conditions, it is extremely expensive and prohibits sintering multiple type products in a single furnace run. Lamination pressure and pressure distribution on the other hand are an extremely simple and inexpensive way of controlling the dimensions. One could make a substrate having low camber and feature distortions and then have the semiconductor device mounted on to the substrate. These semiconductor substrates with the mounted semiconductor device are often referred to as modules and are made from a plurality of ceramic layers forming an MLC (multilayer ceramic) module.

MLC modules are normally used in the electronic industry to package high performance devices (also known as integrated circuits and chips). These high performance devices have a large number of external inputs/outputs (called I/Os) such as pads or solder balls, to name a few, and these devices have a very high power dissipation. In order to accommodate such high performance devices, the MLC module also has to provide a high number of external I/Os, such as pads, pins, solder balls, to name a few, and also be able to handle the very high power dissipation that is being generated both from the module as well as the device.

The MLC substrates are typically laminated with the aid of a uniaxial hydraulic lamination press as is well known to those skilled in the art.

Hass et al. U.S. Pat. No. 5,573,622, the disclosure of which is incorporated by reference herein, discloses an apparatus for laminating substrates having cavities. In the apparatus, a compliant material (for example, a silicone gel), significantly thicker than the depth of the cavity, is applied to the top of the stack of green sheets to aid in the lamination of the stack of green sheets. Lamination is done at a low pressure of 100 to 5000 psi to avoid deforming or rounding the edges of the cavity. A compliant material with large elongation is necessary to the Hass et al. invention.

Lichti et al. U.S. Pat. No. 4,640,711, the disclosure of which is incorporated by reference herein, discloses the compressing of a body by burying it in a bed of flowable particles and applying an external pressure to the flowable particles.

Horner et al. U.S. Pat. No. 5,057,171, the disclosure of which is incorporated by reference herein, discloses an isostatic lamination press wherein an MLC substrate is placed in a liquid which is pressurized.

Strobel et al. U.S. Pat. No. 5,314,646 and Onder U.S. Pat. No. 3,797,986, the disclosures of which are incorporated by reference herein, disclose the dry pressing of powder between rigid surfaces.

One purpose of the present invention is to provide an apparatus and method that will enable better dimensional characteristics in semiconductor substrates.

Another purpose of the present invention is to provide an apparatus and method that will eliminate the need for flattening the semiconductor substrates by refiring.

Yet another purpose of the present invention is the elimination of surface machining/finishing of the semiconductor substrate for post-sinter processing.

BRIEF SUMMARY OF THE INVENTION

A first aspect of the present invention relates to a method for forming an isotropic multilayer ceramic substrate using a lamination press having a bottom plate and a punch for applying lamination pressure to a stacked plurality of ceramic greensheets, the method comprising the steps of:

placing a stacked plurality of ceramic greensheets between the bottom plate and punch of the lamination press;

placing at least one non-metallic pad between the stacked plurality of ceramic greensheets and the bottom plate or between the stacked plurality of ceramic greensheets and the punch; and applying lamination pressure to the at least one non-metallic pad and the stacked plurality of ceramic greensheets, the at least one non-metallic pad causing the lamination pressure to be uniformly distributed across the stacked plurality of ceramic greensheets.

A second aspect of the present invention relates to an apparatus for laminating a plurality of ceramic greensheets comprising:

a frame;

a bottom plate at one end of the frame;

a punch at a second end of the frame; and at least one non-metallic pad within the frame and between the bottom plate and punch;

wherein, in operation, a plurality of ceramic greensheets are placed within the frame, the non-metallic pad is placed underneath of, or on top of, the plurality of ceramic greensheets, and pressure is applied to the at least one non-metallic pad and the plurality of ceramic greensheets wherein the non-metallic pad causes the lamination pressure to be uniformly distributed across the plurality of ceramic greensheets.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
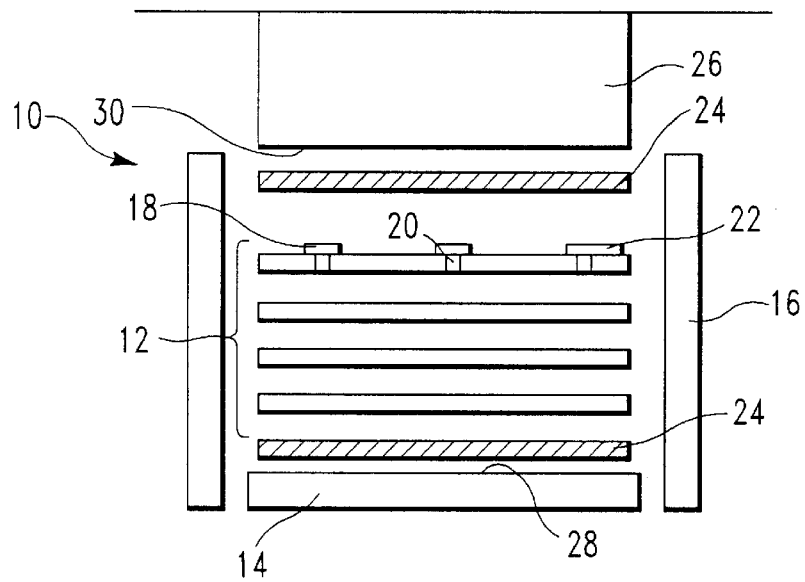
FIG. 1 is a cross sectional view of a green sheet stack to form an MLC substrate within a lamination frame ready for pressing according to the prior art.

Referring to the Figures in more detail, and particularly referring to FIG. 1, there is shown a cross sectional view of a prior art apparatus 10 for laminating a plurality of green sheets 12. The plurality of green sheets 12 are stacked on plate 14 in lamination frame 16. As is conventional, the green sheets will have already been punched and screened with a suitable metallic paste to form features such as cap 18, via 20 and line 22. A sheet of MYLAR (a glycol tetraphthalic acid polyester available from E.I. DuPont de Nemours) 24 is placed underneath and on top of green sheet stack 12 to protect the screened features during the lamination process. Usually, the green sheet stack 12 is then laminated using a hydraulic press (not shown) to move punch 26 towards plate 14. Lamination pressures may range up to 7500 psi. If desired, lamination may also occur at an elevated temperature, up to about 90 degrees C.

Figure 2:
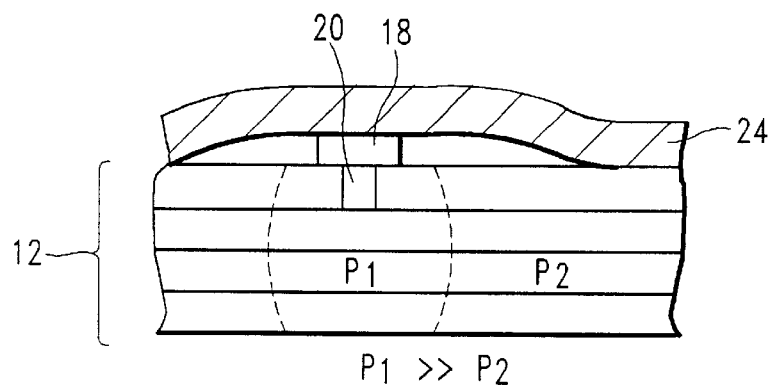
FIG. 2 is an enlarged view of a section of the MLC substrate laminate produced according to the apparatus in FIG. 1.

FIG. 2 is an enlarged cross sectional view of the green sheet stack 12, cap 18 and via 20 during the step of lamination. Due to the fact that the screened features extend about 40 microns above the surface of the green sheet, at the start of the lamination process, the screened features will see all of the load and the non-screened portion of the green sheet will see nearly zero load. This would mean that the screened features and the green sheets under it would see much higher pressure than the designed or intended pressure and the non-screened area of the green sheets would see nearly zero pressure. This is illustrated in FIG. 2 where $P_1$, the pressure proximate to the screened feature, is much greater than $P_2$, the pressure in the non-screened portion of the green sheets. Ultimately, when the features are driven (i.e., embedded) into the green sheet during lamination, the load will be distributed uniformly over the screened and non-screened area. The damage to the laminated stack of green sheets will already have been done, however.

Figure 3:
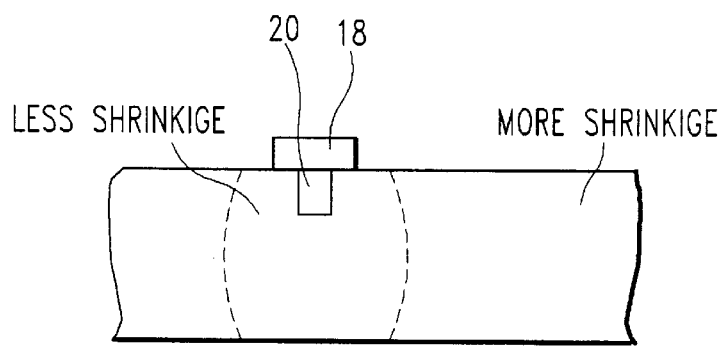
FIG. 3 is an enlarged view similar to FIG. 2 showing the MLC substrate laminate after sintering.

The use of the flat, hard surfaces 28, 30, respectively, of plate 14 and punch 26 during the lamination process to produce the differential pressures noted above will introduce a density gradient into the green sheet laminate. It is well known that higher compression/density in lamination will result in less shrinkage in sintering and lower compression/density in lamination will result in greater shrinkage in sintering, as illustrated in FIG. 3. The density gradient so produced in the green sheet laminate would result in a high degree of camber and feature distortion (i.e., positional error).

Figure 4:
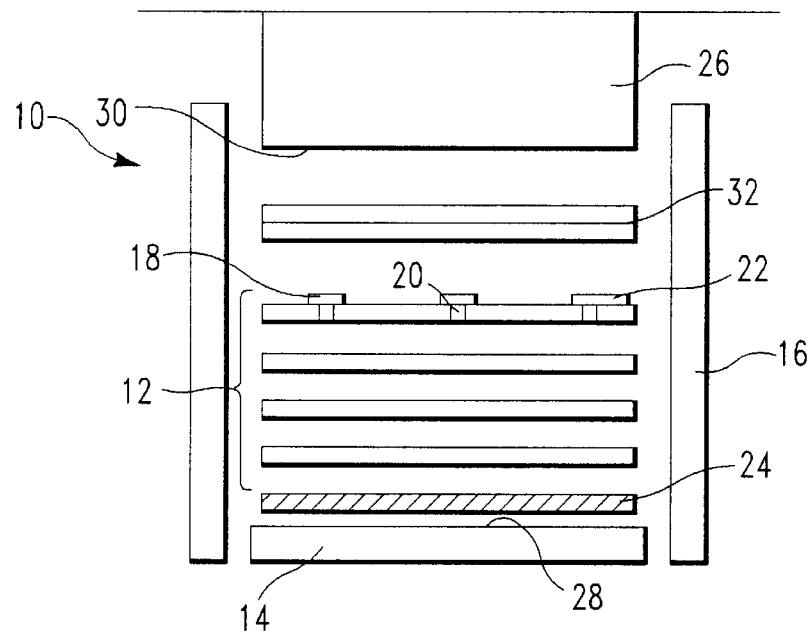
FIG. 4 is a cross sectional view of a green sheet stack to form an MLC substrate within a lamination frame ready for pressing according to a first embodiment of the present invention.

Referring now to FIG. 4, there is shown the apparatus according to the present invention. The apparatus 10 shown in FIG. 4 is identical to the apparatus shown in FIG. 1 except that a non-metallic pad 32 has been placed on top of the stack of green sheets 12. Non-metallic pad 32 serves to evenly distribute the compression pressure over the entire green sheet stack 12 instead of just on the screened features. It is important to the present invention that the non-metallic pad 32 have the right mechanical properties at the lamination temperature. The non-metallic pad 32 should have limited compliance to conform over and around the screened features but yet be stiff enough to cause deformation of the green sheet stack during lamination.

Figure 5:
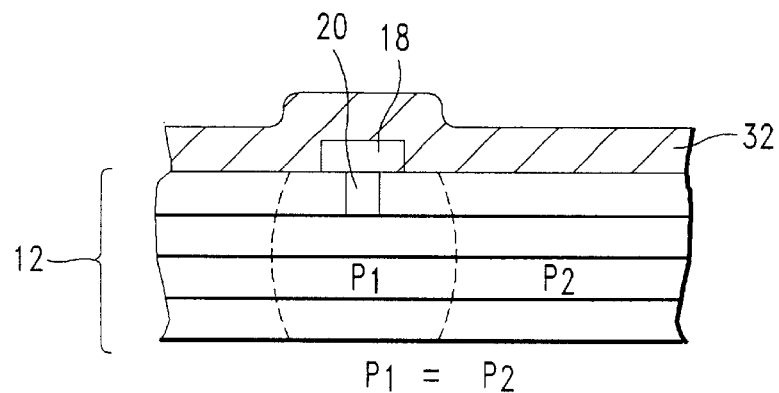
FIG. 5 is an enlarged view of a section of the MLC substrate laminate produced according to the apparatus in FIG. 4.
Figure 6:
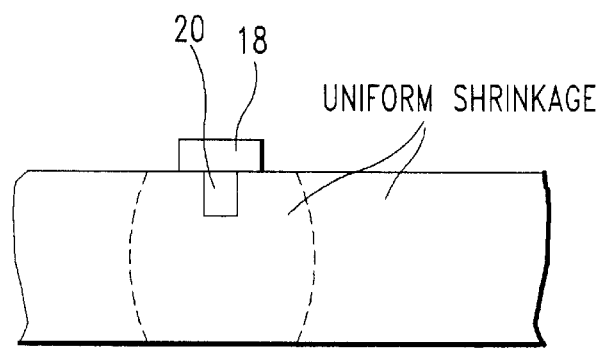
FIG. 6 is an enlarged view similar to FIG. 5 showing the MLC substrate laminate after sintering.

FIG. 5 is an enlarged section of the green sheet stack 12, cap 18 and via 20 during the lamination process. The screened features no longer support the entire load. Consequently, $P_1$ is now approximately equal to $P_2$. With no density gradient apparent, the green sheet laminate will sinter with uniform shrinkage, as illustrated in FIG. 6, thereby eliminating or significantly reducing camber and feature distortion.

Figure 7:
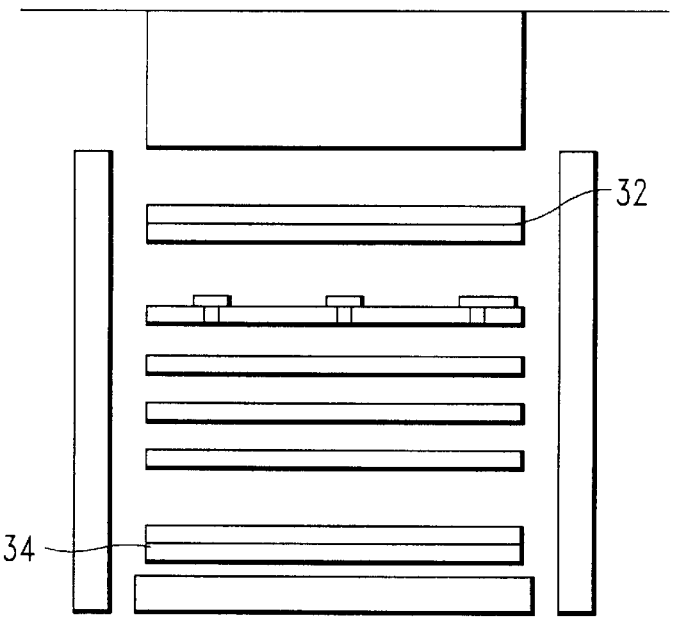
FIG. 7 is a cross sectional view of a green sheet stack to form an MLC substrate within a lamination frame ready for pressing according to a second embodiment of the present invention.

Referring back to FIG. 4, the inventive non-metallic pad 32 is placed only on top of the green sheet stack 12. It may be desirable under certain circumstances, such as when the screened features extend more than 40–50 microns above the surface of the green sheet or if the green sheet is screened on both sides, to have a first non-metallic pad 32 separating the green sheet stack 12 from the punch 26 and a second non-metallic pad 34 separating the green sheet stack 12 from the plate 14. The latter embodiment is illustrated in FIG. 7.

Figure 8:
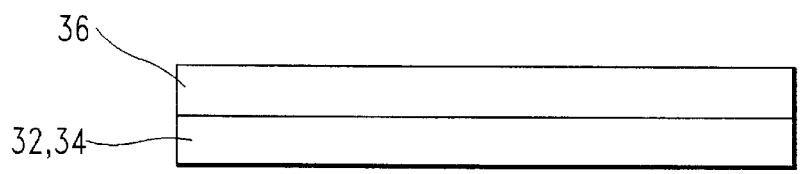
FIG. 8 is a cross sectional view of a first embodiment of a non-metallic pad according to the present invention.

Preferred embodiments of the non-metallic pad 32, 34 are discussed with reference to FIGS. 8 to 11. Referring to FIG. 8, non-metallic pad 32, 34 comprises a sheet of paraffin wax, up to 15 mils thick but preferably over 3–5 mils thick. The paraffin should have its glass transition temperature, $T_g$, less than the lamination temperature (for example, 75 degrees Centigrade) so that it softens during lamination. Any kind of paraffin wax should suffice for the purposes of the present invention. The sheet of paraffin wax may be surface bonded, cast or molded onto a backing sheet 36. The backing sheet 36 may be selected from polymers such as polyethylene, polypropylene or polyurethane, to name a few, or rubbers such as latex rubber or silicone rubber, to name a few. In operation, the non-metallic pad 32, 34 and optional backing sheet 36 are placed on the green sheet stack 12 with the non-metallic pad 32, 34 in contact with the green sheet stack 12 and then heated and compressed using conventional lamination tools such as an hydraulic press or isostatic lamination press. During the preheat of the lamination apparatus, the non-metallic pad 32, 34 deforms and surrounds the screened features. The load applied by the apparatus 10 is then evenly distributed through the non-metallic pad 32, 34 and over the entire green sheet stack 12. Hence, there is no gradient in the pressure and therefore there is no gradient in the density of the green sheet laminate. The resulting isotropic density distribution leads to flatter substrates with minimal distortion during sintering.

Figure 9:
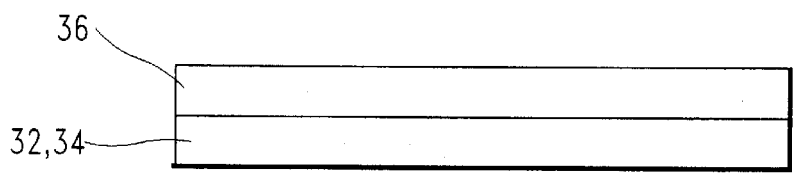
FIG. 9 is a cross sectional view of a second embodiment of a non-metallic pad according to the present invention.

If desired, the sheet of paraffin wax may be loaded with metallic and/or ceramic particles, such as alumina, aluminum nitride, copper and aluminum, to name a few, with a particle size up to 20 microns, as illustrated in FIG. 9. The metallic and/or ceramic particles should comprise 50–80 volume percent of the paraffin wax/particle mixture. The metallic and/or ceramic particles not only help to distribute the heat uniformly, but also help to flatten the screened features and partially bury them into the green sheets.

Figure 10:
FIG. 10 is a cross sectional view of a third embodiment of a non-metallic pad according to the present invention.
Figure 11:
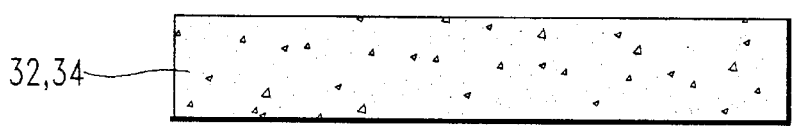
FIG. 11 is a cross sectional view of a fourth embodiment of a non-metallic pad according to the present invention.

Another embodiment of the non-metallic pad is illustrated in FIG. 10. The inventive non-metallic pad 32, 34 is a sheet of metallic and/or ceramic particles, such as alumina, aluminum nitride, copper and aluminum, to name a few, with a particle size up to 20 microns, cemented with a fully or partially (thermally or UV) cured elastomer, such as silicone rubber or latex rubber. It is important that the elastomer not stick to the green sheet or metallic features. The sheet should have a durometer reading of greater than 60 and have an elongation of at least 20% at the lamination temperature. The porosity of the sheet should be 0 to 50%. The percentage of rubber preferably should be no more than 50 volume percent but in any case, less than about 80 volume percent.

A last embodiment of the inventive non-metallic pad 32, 34 is a planar bag filled with metallic and/or ceramic particles, such as alumina, aluminum nitride, copper and aluminum, to name a few. The bag material can be a polymer such as polyurethane or a silicone or latex rubber with an elongation greater than 20% at the lamination temperature. The particle size of the powder material should be in the submicron range such as 0.01 to 0.1 microns.

The advantages of the present invention are further illustrated in the following examples.

EXAMPLES

A series of green sheets were prepared in a conventional manner. The green sheets were stacked to form five stacks for lamination and then each stack was placed in a conventional lamination frame. Each stack was laminated at a temperature of 75 degrees Centigrade and a lamination pressure of 4200 psi.

The first stack was laminated according to the prior art method shown in FIG. 1 using Mylar. The metallic features were observed to be embedded in the green sheets. After conventional sintering, the laminated substrate exhibited camber of 100–150 microns with a positional error greater than 150 microns.

It is desirable to have the metallic features embedded since the metallic features are flat so that post-sinter processing (chip attach, pin attach, wire bonding, etc.) is facilitated.

The second stack was laminated using a fully cured (UV cured) silicone rubber without any ceramic or metallic particles and exhibited camber and positional error similar to that of the first stack. Also, unlike the first stack, the metallic features were not embedded.

The third stack was laminated using 5 mil thick paraffin on Mylar backing in the apparatus of FIG. 4. After conventional sintering, the laminated substrate exhibited camber of 40–50 microns and a positional error of less than 50 microns. All of the metal features were embedded in the green sheet.

The fourth stack was laminated using fully UV cured silicone rubber in the apparatus of FIG. 4. In addition, the silicone rubber had 50 volume percent of 5 micron alumina particles. There was no porosity in the silicone rubber/ alumina particle sheet. After conventional sintering, the laminated substrate exhibited camber of 40–50 microns and a positional error of less than 50 microns. All of the metal features were embedded in the green sheet.

The fifth stack was laminated using a 3 mil thick bag of polyurethane filled with 0.01 micron alumina particles. After conventional sintering, the laminated substrate exhibited camber of 40–50 microns and a positional error of less than 50 microns. All of the metal features were embedded in the green sheet.

As can be seen from the above examples, improved substrate laminates having less camber and positional error were obtained with the inventive non-metallic pad according to the present invention. The substrate laminate formed from the first stack gave poor results due to the limited and insufficient compliance of the Mylar. The substrate laminate formed from the second stack gave poor results due to the limited and insufficient stiffness of the silicone rubber.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for forming an isotropic multilayer ceramic substrate using a lamination press having a bottom plate and a punch for applying lamination pressure to a stacked plurality of ceramic greensheets, the method comprising the steps of:

placing a stacked plurality of ceramic greensheets between the bottom plate and punch of the lamination press;

placing at least one non-metallic pad between the stacked plurality of ceramic greensheets and the bottom plate or between the stacked plurality of ceramic greensheets and the punch, wherein the at least one non-metallic pad consists of paraffin wax; and applying lamination pressure to the at least one non-metallic pad and the stacked plurality of ceramic greensheets, the at least one non-metallic pad causing the lamination pressure to be uniformly distributed across the stacked plurality of ceramic greensheets.

2. The method of claim 1 further comprising the step of sintering the laminated stacked plurality of ceramic greensheets, thereby resulting in a multilayer ceramic substrate having isotropic density.

3. The method of claim 1 wherein the at least one non-metallic pad is placed between the stacked plurality of ceramic greensheets and the bottom plate.

4. The method of claim 1 wherein the at least one non-metallic pad is placed between the stacked plurality of ceramic greensheets and the punch.

5. The method of claim 1 wherein a first non-metallic pad is placed between the stacked plurality of ceramic greensheets and the bottom plate and a second non-metallic pad is placed between the stacked plurality of ceramic greensheets and the punch.

6. The method of claim 1 wherein the at least one non-metallic pad elongates at least 20% during the step of applying lamination pressure.

7. A method for forming an isotropic multilayer ceramic substrate using a lamination press having a bottom plate and a punch for applying lamination pressure to a stacked plurality of ceramic greensheets, the method comprising the steps of:

placing a stacked plurality of ceramic greensheets between the bottom plate and punch of the lamination press;

placing at least one non-metallic pad between the stacked plurality of ceramic greensheets and the bottom plate or between the stacked plurality of ceramic greensheets and the punch, wherein the at least one non-metallic pad comprises paraffin wax and particulates selected from the group consisting of ceramic particles, metallic particles and mixtures thereof; and applying lamination pressure to the at least one non-metallic pad and the stacked plurality of ceramic greensheets, the at least one non-metallic pad causing the lamination pressure to be uniformly distributed across the stacked plurality of ceramic greensheets.

8. The method of claim 7 further comprising the step of sintering the laminated stacked plurality of ceramic greensheets, thereby resulting in a multilayer ceramic substrate having isotropic density.

9. The method of claim 7 wherein the at least one non-metallic pad is placed between the stacked plurality of ceramic greensheets and the bottom plate.

10. The method of claim 7 wherein the at least one non-metallic pad is placed between the stacked plurality of ceramic greensheets and the punch.

11. The method of claim 7 wherein a first non-metallic pad is placed between the stacked plurality of ceramic greensheets and the bottom plate and a second non-metallic pad is placed between the stacked plurality of ceramic greensheets and the punch.

12. A method for forming an isotropic multilayer ceramic substrate using a lamination press having a bottom plate and a punch for applying lamination pressure to a stacked plurality of ceramic greensheets, the method comprising the steps of:

placing a stacked plurality of ceramic greensheets between the bottom plate and punch of the lamination press;

placing at least one non-metallic pad between the stacked plurality of ceramic greensheets and the bottom plate or between the stacked plurality of ceramic greensheets and the punch, wherein the at least one non-metallic pad comprises silicone rubber and particulates selected from the group consisting of ceramic particles, metallic particles and mixtures thereof; and applying lamination pressure to the at least one non-metallic pad and the stacked plurality of ceramic greensheets, the at least one non-metallic pad causing the lamination pressure to be uniformly distributed across the stacked plurality of ceramic greensheets.

13. The method of claim 8 wherein the at least one non-metallic pad has 0 to 50 volume percent porosity.

14. The method of claim 12 further comprising the step of sintering the laminated stacked plurality of ceramic greensheets, thereby resulting in a multilayer ceramic substrate having isotropic density.

15. The method of claim 12 wherein the at least one non-metallic pad is placed between the stacked plurality of ceramic greensheets and the bottom plate.

16. The method of claim 12 wherein the at least one non-metallic pad is placed between the stacked plurality of ceramic greensheets and the punch.

17. The method of claim 12 wherein a first non-metallic pad is placed between the stacked plurality of ceramic greensheets and the bottom plate and a second non-metallic pad is placed between the stacked plurality of ceramic greensheets and the punch.

18. A method for forming an isotropic multilayer ceramic substrate using a lamination press having a bottom plate and a punch for applying lamination pressure to a stacked plurality of ceramic greensheets, the method comprising the steps of:

placing a stacked plurality of ceramic greensheets between the bottom plate and punch of the lamination press;

placing at least one non-metallic pad between the stacked plurality of ceramic greensheets and the bottom plate or between the stacked plurality of ceramic greensheets and the punch, wherein the at least one non-metallic pad comprises a thermoplastic or elastomeric material bag filled with microspheres; and applying lamination pressure to the at least one non-metallic pad and the stacked plurality of ceramic greensheets, the at least one non-metallic pad causing the lamination pressure to be uniformly distributed across the stacked plurality of ceramic greensheets.

19. The method of claim 18 wherein the microspheres are selected from the group consisting of ceramic particles, metallic particles and mixtures thereof.

20. The method of claim 18 further comprising the step of sintering the laminated stacked plurality of ceramic greensheets, thereby resulting in a multilayer ceramic substrate having isotropic density.

21. The method of claim 18 wherein the at least one non-metallic pad is placed between the stacked plurality of ceramic greensheets and the bottom plate.

22. The method of claim 18 wherein the at least one non-metallic pad is placed between the stacked plurality of ceramic greensheets and the punch.

23. The method of claim 18 wherein a first non-metallic pad is placed between the stacked plurality of ceramic greensheets and the bottom plate and a second non-metallic pad is placed between the stacked plurality of ceramic greensheets and the punch.

24. A method for forming an isotropic multilayer ceramic substrate using a lamination press having a bottom plate and a punch for applying lamination pressure to a stacked plurality of ceramic greensheets, the method comprising the steps of:

placing a stacked plurality of ceramic greensheets between the bottom plate and punch of the lamination press;

placing at least one non-metallic pad between the stacked plurality of ceramic greensheets and the bottom plate or between the stacked plurality of ceramic greensheets and the punch; and applying lamination pressure to the at least one non-metallic pad and the stacked plurality of ceramic greensheets, the at least one non-metallic pad causing the lamination pressure to be uniformly distributed across the stacked plurality of ceramic greensheets, wherein each of the ceramic greensheets in the stacked plurality of ceramic greensheets have metallic features on a surface thereof and wherein the metallic features are at least partially embedded in the ceramic greensheets after the step of applying lamination pressure.

25. The method of claim 24 further comprising the step of sintering the laminated stacked plurality of ceramic greensheets, thereby resulting in a multilayer ceramic substrate having isotropic density.

26. The method of claim 24 wherein the at least one non-metallic pad is placed between the stacked plurality of ceramic greensheets and the bottom plate.

27. The method of claim 24 wherein the at least one non-metallic pad is placed between the stacked plurality of ceramic greensheets and the punch.

28. The method of claim 24 wherein a first non-metallic pad is placed between the stacked plurality of ceramic greensheets and the bottom plate and a second non-metallic pad is placed between the stacked plurality of ceramic greensheets and the punch.

29. An apparatus for laminating a plurality of ceramic greensheets comprising:

a frame;

a bottom plate at one end of the frame;

a punch at a second end of the frame; and at least one non-metallic pad within the frame and between the bottom plate and punch, wherein the at least one non-metallic pad consists of paraffin wax;

wherein, in operation, a plurality of ceramic greensheets are placed within the frame, the non-metallic pad is placed underneath of, or on top of, the plurality of ceramic greensheets, and pressure is applied to the at least one non-metallic pad and the plurality of ceramic greensheets wherein the non-metallic pad causes the lamination pressure to be uniformly distributed across the plurality of ceramic greensheets.

30. The apparatus of claim 29 wherein the at least one non-metallic pad is placed underneath the plurality of ceramic greensheets.

31. The apparatus of claim 29 wherein the at least one non-metallic pad is placed on top of the plurality of ceramic greensheets.

32. The apparatus of claim 29 further comprising a second non-metallic pad wherein, in operation, one non-metallic metallic pad is placed underneath the plurality of ceramic greensheets and the second non-metallic pad is placed on top of the plurality of ceramic greensheets.

33. The apparatus of claim 29 wherein the at least one non-metallic pad elongates at least 20% when lamination pressure is applied.

34. An apparatus for laminating a plurality of ceramic greensheets comprising:

a frame;

a bottom plate at one end of the frame;

a punch at a second end of the frame; and at least one non-metallic pad within the frame and between the bottom plate and punch, wherein the at least one non-metallic pad comprises paraffin wax and particulates selected from the group consisting of ceramic particles, metallic particles and mixtures thereof;

wherein, in operation, a plurality of ceramic greensheets are placed within the frame, the non-metallic pad is placed underneath of, or on top of, the plurality of ceramic greensheets, and pressure is applied to the at least one non-metallic pad and the plurality of ceramic greensheets wherein the non-metallic pad causes the lamination pressure to be uniformly distributed across the plurality of ceramic greensheets.

35. The apparatus of claim 34 wherein the at least one non-metallic pad is placed underneath the plurality of ceramic greensheets.

36. The apparatus of claim 34 wherein the at least one non-metallic pad is placed on top of the plurality of ceramic greensheets.

37. The apparatus of claim 34 further comprising a second non-metallic pad wherein, in operation, one non-metallic metallic pad is placed underneath the plurality of ceramic greensheets and the second non-metallic pad is placed on top of the plurality of ceramic greensheets.

38. An apparatus for laminating a plurality of ceramic greensheets comprising:

a frame;

a bottom plate at one end of the frame;

a punch at a second end of the frame; and at least one non-metallic pad within the frame and between the bottom plate and punch, wherein the at least one non-metallic pad comprises silicone rubber and particulates selected from the group consisting of ceramic particles, metallic particles and mixtures thereof;

wherein, in operation, a plurality of ceramic greensheets are placed within the frame, the non-metallic pad is placed underneath of, or on top of, the plurality of ceramic greensheets, and pressure is applied to the at least one non-metallic pad and the plurality of ceramic greensheets wherein the non-metallic pad causes the lamination pressure to be uniformly distributed across the plurality of ceramic greensheets.

39. The apparatus of claim 38 wherein the at least one non-metallic pad has 0 to 50 volume percent porosity.

40. The apparatus of claim 38 wherein the at least one non-metallic pad is placed underneath the plurality of ceramic greensheets.

41. The apparatus of claim 38 wherein the at least one non-metallic pad is placed on top of the plurality of ceramic greensheets.

42. The apparatus of claim 38 further comprising a second non-metallic pad wherein, in operation, one non-metallic metallic pad is placed underneath the plurality of ceramic greensheets and the second non-metallic pad is placed on top of the plurality of ceramic greensheets.

43. An apparatus for laminating a plurality of ceramic greensheets comprising:

a frame;

a bottom plate at one end of the frame;

a punch at a second end of the frame; and at least one non-metallic pad within the frame and between the bottom plate and punch, wherein the at least one non-metallic pad comprises a thermoplastic or elastomeric material bag filled with microspheres;

wherein, in operation, a plurality of ceramic greensheets are placed within the frame, the non-metallic pad is placed underneath of, or on top of, the plurality of ceramic greensheets, and pressure is applied to the at least one non-metallic pad and the plurality of ceramic greensheets wherein the non-metallic pad causes the lamination pressure to be uniformly distributed across the plurality of ceramic greensheets.

44. The apparatus of claim 43 wherein the microspheres are selected from the group consisting of ceramic particles, metallic particles and mixtures thereof.

45. The apparatus of claim 43 wherein the at least one non-metallic pad is placed underneath the plurality of ceramic greensheets.

46. The apparatus of claim 43 wherein the at least one non-metallic pad is placed on top of the plurality of ceramic greensheets.

47. The apparatus of claim 43 further comprising a second non-metallic pad wherein, in operation, one non-metallic metallic pad is placed underneath the plurality of ceramic greensheets and the second non-metallic pad is placed on top of the plurality of ceramic greensheets.

48. An apparatus for laminating a plurality of ceramic greensheets comprising:

a frame;

a bottom plate at one end of the frame;

a punch at a second end of the frame; and at least one non-metallic pad within the frame and between the bottom plate and punch;

wherein, in operation, a plurality of ceramic greensheets are placed within the frame, the non-metallic pad is placed underneath of, or on top of, the plurality of ceramic greensheets and pressure is applied to the at least one non-metallic pad and the plurality of ceramic greensheets wherein the non-metallic pad causes the lamination pressure to be uniformly distributed across the plurality of ceramic greensheets, wherein each of the ceramic greensheets in the plurality of ceramic greensheets have metallic features on a surface thereof and wherein the metallic features are at least partially embedded in the ceramic greensheets after lamination pressure is applied.

49. The apparatus of claim 48 wherein the at least one non-metallic pad is placed underneath the plurality of ceramic greensheets.

50. The apparatus of claim 48 wherein the at least one non-metallic pad is placed on top of the plurality of ceramic greensheets.

51. The apparatus of claim 48 further comprising a second non-metallic pad wherein, in operation, one non-metallic metallic pad is placed underneath the plurality of ceramic greensheets and the second non-metallic pad is placed on top of the plurality of ceramic greensheets.

* * * * *